United States Patent
Mackey et al.

(10) Patent No.: US 7,283,205 B2
(45) Date of Patent: Oct. 16, 2007

(54) OPTIMIZED OPTICAL LITHOGRAPHY ILLUMINATION SOURCE FOR USE DURING THE MANUFACTURE OF A SEMICONDUCTOR DEVICE

(75) Inventors: Jeffrey L. Mackey, Boise, ID (US); William A. Stanton, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 244 days.

(21) Appl. No.: 11/038,673

(22) Filed: Jan. 19, 2005

(65) Prior Publication Data

US 2006/0158633 A1    Jul. 20, 2006

(51) Int. Cl.
G03B 27/54 (2006.01)
G03B 27/72 (2006.01)
G02B 27/44 (2006.01)

(52) U.S. Cl. .................. 355/67; 355/71; 359/565
(58) Field of Classification Search .................. 355/52, 355/53, 55, 67–71; 250/548; 356/399–401; 430/5, 311; 359/565, 569
See application file for complete search history.

(56) References Cited

U.S. PATENT DOCUMENTS 5,712,698 A * 1/1998 Poschenrieder et al. ...... 355/71
6,245,468 B1   6/2001 Futrell et al. ................. 430/5
6,452,662 B2 * 9/2002 Mulkens et al. .............. 355/67
7,046,339 B2 * 5/2006 Stanton et al. ................ 355/71

OTHER PUBLICATIONS

Frank Schellenberg, "A Little Light Magic", IEEE Spectrum, Sep. 2003, pp. 34-39.
"LithoCruiser" Product Brochure, ASML MaskTools, 2002, 2 pages.
"LithoCruiser", Product Brochure, ASML MaskTools, 2002, 3 pages.

* cited by examiner

Primary Examiner—Henry Hung Nguyen

(57) ABSTRACT

A method and structure for optimizing an optical lithography illumination source may include a shaped diffractive optical element (DOE) interposed between the illuminator and a lens during the exposure of a photoresist layer over a semiconductor wafer. The DOE may, in some instances, increase depth of focus, improve the normalized image log-slope, and improve pattern fidelity. The DOE is customized for the particular pattern to be exposed. Description and depiction of a specific DOE for a specific pattern is provided. Additionally, a pupilgram having a particular pattern, and methods for providing a light output which forms the pupilgram, are disclosed.

9 Claims, 10 Drawing Sheets

OPTIMIZED OPTICAL LITHOGRAPHY ILLUMINATION SOURCE FOR USE DURING THE MANUFACTURE OF A SEMICONDUCTOR DEVICE

FIELD OF THE INVENTION

This invention relates to the field of semiconductor manufacture and, more particularly, to a method and structure for optimizing optical lithography during the formation of a semiconductor device.

BACKGROUND OF THE INVENTION

During the formation of a semiconductor device many features such as conductors (word lines, digit lines), electrical contacts, and other physical features are commonly formed from, into, and over a semiconductor wafer. A goal of semiconductor device engineers is to form as many of these features in a given area as possible to increase yield percentages and to decrease device size and manufacturing costs.

All heterogeneous structures on a semiconductor wafer require the use of lithography. Optical lithography, the lithographic method most used in leading-edge wafer processing, comprises projecting coherent light of a given wavelength from an illumination source (illuminator) through a quartz photomask or reticle having a chrome pattern thereon, and imaging that pattern onto a photoresist-coated wafer. The light chemically alters the photoactive photoresist and allows the exposed photoresist (if positive resist is used) or the unexposed photoresist (if negative resist is used) to be rinsed away using a developer.

With decreasing feature sizes, the limits of optical lithography are continually being tested and lithographic methods and materials are continually being improved through various developments, generally referred to as resolution enhancement techniques (RET's). RET's alter various aspects of the lithographic process to optimize the size and shape of a desired feature. For example, the wavelength of light used to expose the photoresist may be decreased, as longer wavelengths cannot resolve the decreasing feature sizes. The wavelength used with lithographic equipment has decreased from 365 nanometers (nm) in the mid-1980's to the current standard of 193 nm. Another RET includes optical proximity correction, which uses subresolution changes in the chrome pattern on the photomask or reticle to optimize the shape of the light focused on the photoresist. Without optical proximity correction, the chrome pattern is a scaled shape of the pattern which is to be produced. With very small features, a scaled shape does not produce the desired pattern due to diffraction effects. However, the chrome photomask features can be modified in a manner which attempts to account for these diffraction effects. U.S. Pat. No. 6,245,468 by Futrell et al., assigned to Micron Technology, Inc. and incorporated herein by reference as if set forth in its entirety, describes an optical proximity correction apparatus and method. A third RET uses unequal photomask thickness of the quartz on which the chrome is formed at selected locations between the chrome to provide a phase-shift photomask. Phase shifting sets up destructive interference between adjacent light waves to enhance the pattern formed on the photoresist.

Another resolution enhancement technique is off-axis illumination, which improves the resolution of repeating patterns found in semiconductor device manufacture. FIG. 1 depicts an apparatus comprising off-axis illumination, and depicts an illuminator 10 comprising a laser which provides a coherent light source 12, an optical element 14, a zoom axicon 16, a first reflector 18, an optical homogenizer, a blade 22, a second reflector 24, a vertical photomask 26, a lens 28, and a wafer 30 comprising a layer of photoresist (not individually depicted).

In use, the coherent light 12 is output by the illuminator 10, which travels through the optical element 14. The optical element, which in FIG. 1 is depicted as a dipole element, directs the light in particular patterns of angles and improves the light pattern focused on the photoresist. In use, the dipole optical element 14 is used in FIG. 1 to expose a vertical photomask 26. The optical element 14 is then rotated 90° to expose the horizontal photomask 32 as depicted in FIG. 2. After exiting the optical element 14, the light reaches the zoom axicon 16 which allows some control over the size and position of the light source 12. Depending on the equipment used, the direction of light output from the zoom axicon may be changed 90° by the first reflector 18. The optical homogenizer 20 normalizes the intensity of light across the coherent beam such that any granularity is removed. In some instances a blade 22 is used instead of the optical element 14, for example during testing of a particular pattern. A second reflector 24 may change the direction of the source 12 depending on the equipment used. The source 12 then reaches the chromed reticle, depicted as a vertical reticle 26 in FIG. 1 and as a horizontal reticle 32 in FIG. 2, which determines the pattern which is focused through the lens 28 and onto the photoresist which covers the semiconductor wafer 30.

A structure similar to this, as well as the other RET's previous listed, are described and illustrated in *A Little Light Magic*, IEEE Spectrum, Sep. 2003, pp. 34-39.

While a dipole element is depicted in FIGS. 1 and 2, other optical elements are used for various patterns in addition to the dipole element 14 depicted in FIG. 1. FIG. 3 depicts a quadrupole element 36 and an annular element 38.

Melioration to resolution enhancement techniques which would further improve the pattern produced on a photoresist layer during the formation of a semiconductor device would be desirable.

SUMMARY OF THE INVENTION

The present invention provides a method and apparatus which, among other advantages, improves optical lithography process latitude when forming semiconductor device features near the lithographic resolution limit. In accordance with one embodiment of the invention, a diffractive optical element (DOE) having a novel pattern, specifically a hexapole pattern, is used to shape the coherent beam. The DOE is interposed between the illuminator and the photomask to configure the light pattern produced by the illuminator. For example, the DOE may be affixed to the illuminator or be affixed in another location between the illuminator and the photomask or reticle to shape the coherent beam. The hexapole element has a specific defined shape tailored to the general pattern being transferred to a photoresist layer which covers a semiconductor substrate assembly comprising a wafer.

An exemplary DOE or blade having the specific shape is depicted by FIG. 5. A particular, exemplary light pattern produced by the embodiment of the invention is depicted schematically in FIG. 8., which is a schematic representation of a pupilgram. This light pattern may be produced by other means as described below. An inventive lithography system comprising the inventive DOE or blade is also described.

Advantages will become apparent to those skilled in the art from the following detailed description read in conjunction with the appended claims and the drawings attached hereto.

It should be emphasized that the drawings herein, unless specified as such, may not be to exact scale and are schematic representations. The drawings are not intended to portray the specific parameters, materials, particular uses, or the structural details of the invention, which can be determined by one of skill in the art by examination of the information herein. Further, various embodiments of the present invention may be used as either a "DOE" or a "blade," and these terms, except where noted, may be generally used interchangeably with respect to various embodiments of the present invention and are collectively referred to herein as a "light mask." It is established that blades are typically used for testing a particular pattern of a light mask and DOE's are used during semiconductor device manufacturing as a light mask. The term "light mask" will also be understood to encompass apparatuses having multiple light-blocking or light-altering elements (such as a zoom axicon used in conjunction with a blade) used to create a particular light pattern.

DETAILED DESCRIPTION OF THE ILLUSTRATED EMBODIMENT

The term "wafer" is to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" in the following description, previous process steps may have been utilized to form regions or junctions in or over the base semiconductor structure or foundation. Additionally, when reference is made to a "substrate assembly" in the following description, the substrate assembly may include a wafer with layers including dielectrics and conductors, and features such as transistors, formed thereover, depending on the particular stage of processing.

Figure 1:
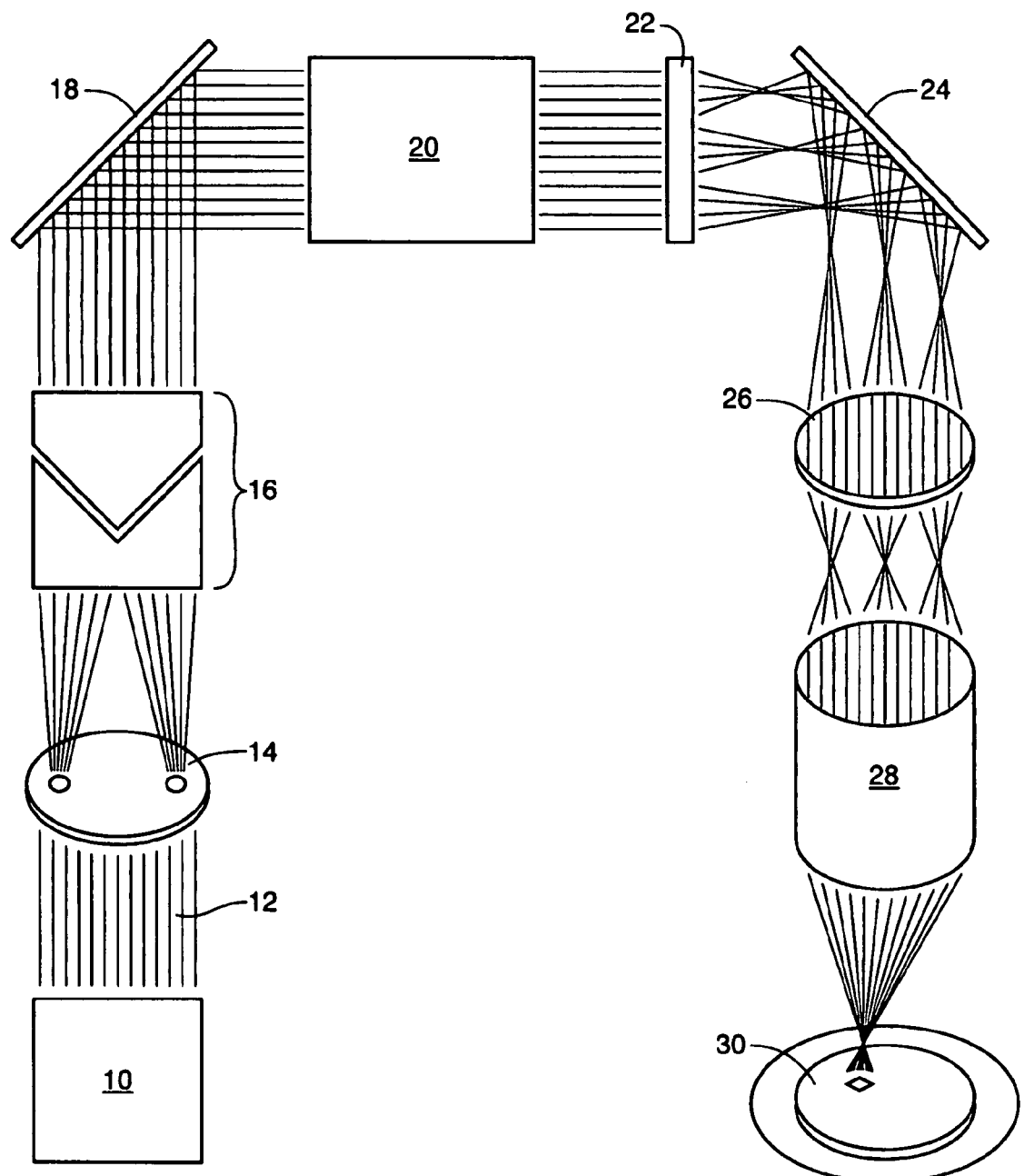
FIG. 1 depicts a conventional optical lithography apparatus comprising a dipole optical element exposing vertical lines.
Figure 2:
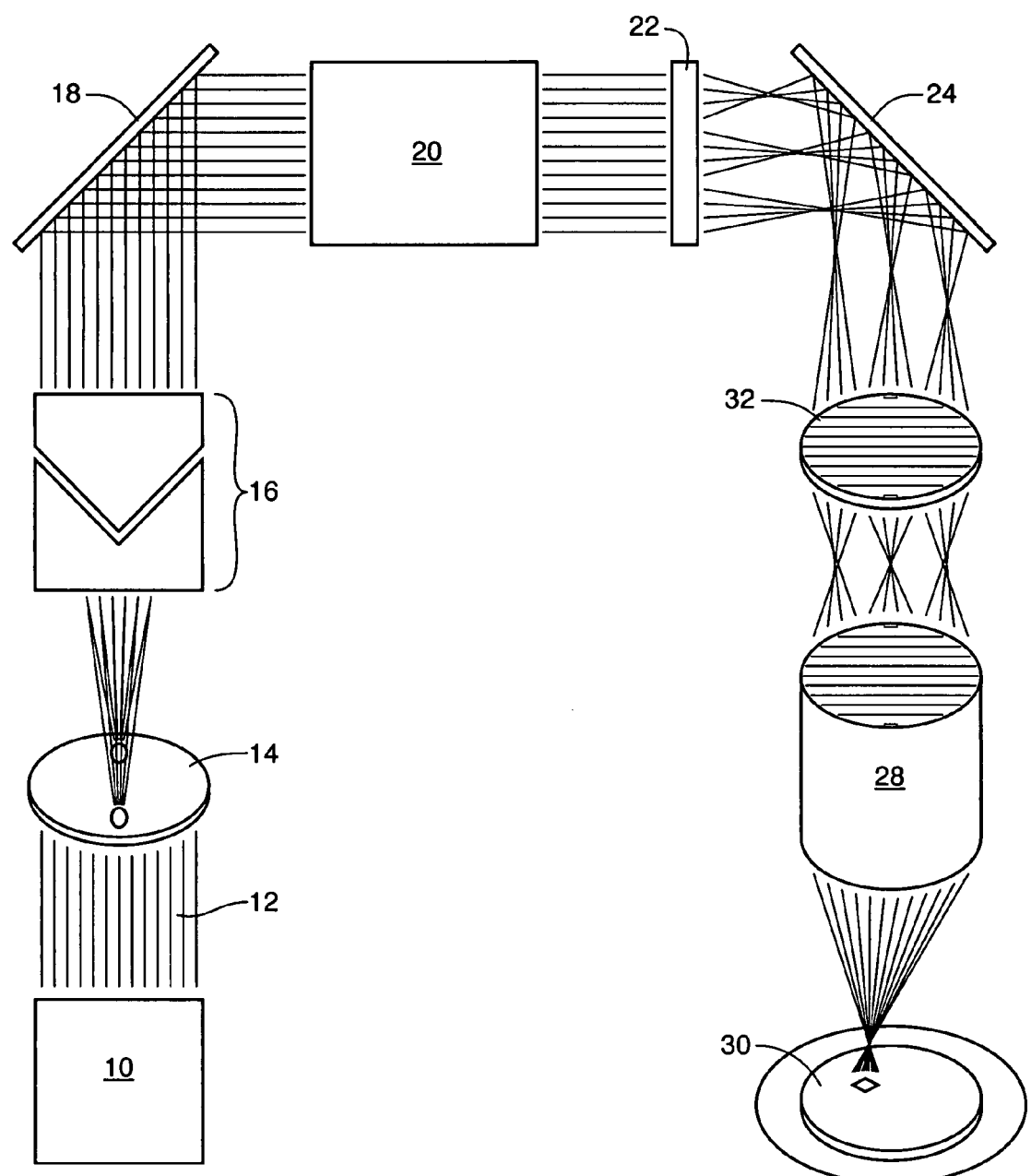
FIG. 2 depicts a conventional optical lithography apparatus similar to FIG. 1, except that the dipole optical element has been rotated to expose horizontal lines.
Figure 3:
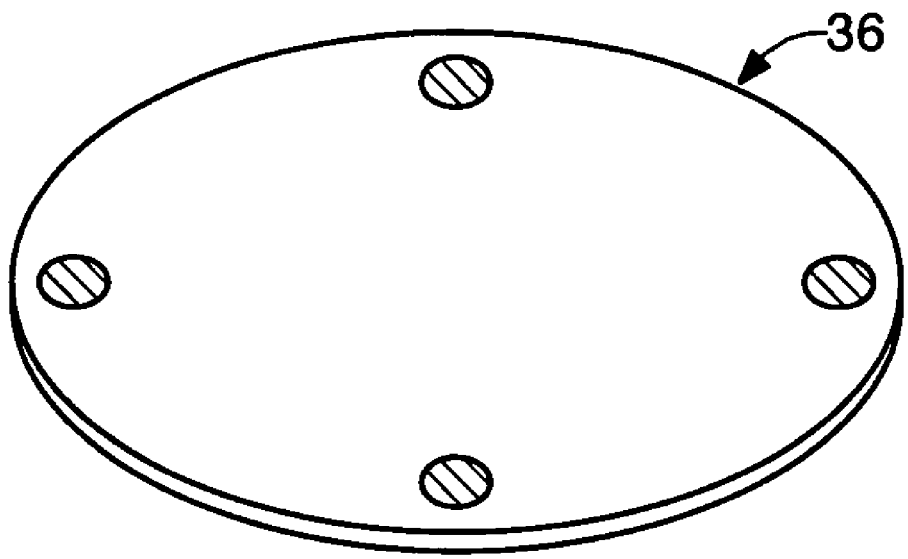
FIG. 3 depicts two different conventional optical elements for exposing a photoresist layer over a semiconductor wafer.
Figure 3:
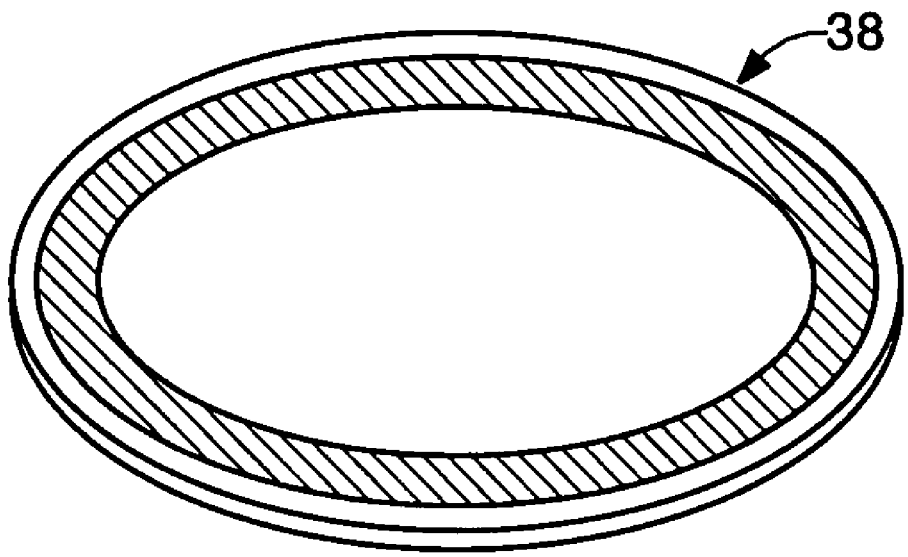
Figure 4:
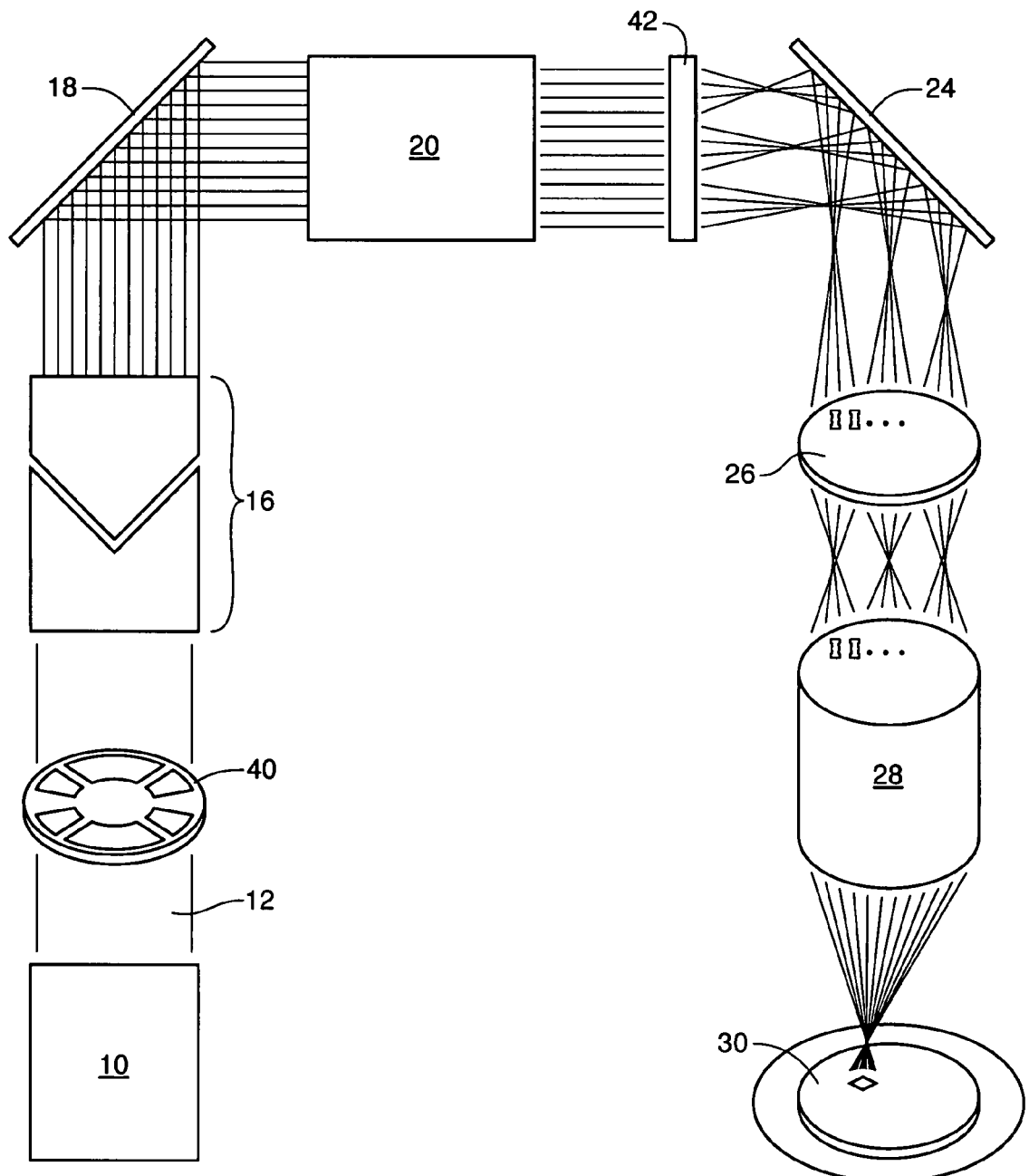
FIG. 4 depicts an optical lithography apparatus comprising both a diffractive optical element (DOE) and a blade, either of which may comprise an embodiment of the invention to shape the output of the illuminator.

A first embodiment of the invention is depicted in FIG. 4 which illustrates an off-axis photolithographic illumination system comprising an illuminator 10 which outputs a coherent light source 12 to an inventive diffractive optical element (DOE) 40 which shapes the light beam 12 to a pattern customized to the pattern on the reticle 26. After light beam 12 passes through DOE 40, it may pass through a zoom axicon 16 which may scale the pattern to a larger or smaller size. A first reflector 18 may be used to change the direction of the light, depending on the equipment used, which then passes through an optical homogenizer 20 to normalize the intensity of the light across the beam. The DOE may be located at the location depicted by blade 42 rather than at DOE location depicted at 40. Only one of blade aperture 40 and diffractive optical element 42 will typically be used in a photolithography system represented by the FIG. 4 depiction, although both are illustrated. Further, the blade or DOE, if workable, may be placed at another suitable location between the light source 10 and the wafer 30 of the FIG. 4 apparatus. A second reflector 24 may be used to change the direction of the beam, depending on the equipment used. The beam then passes through reticle 26, through lens 28, and finally exposes photoresist (not individually depicted) on wafer 30.

Figure 5:
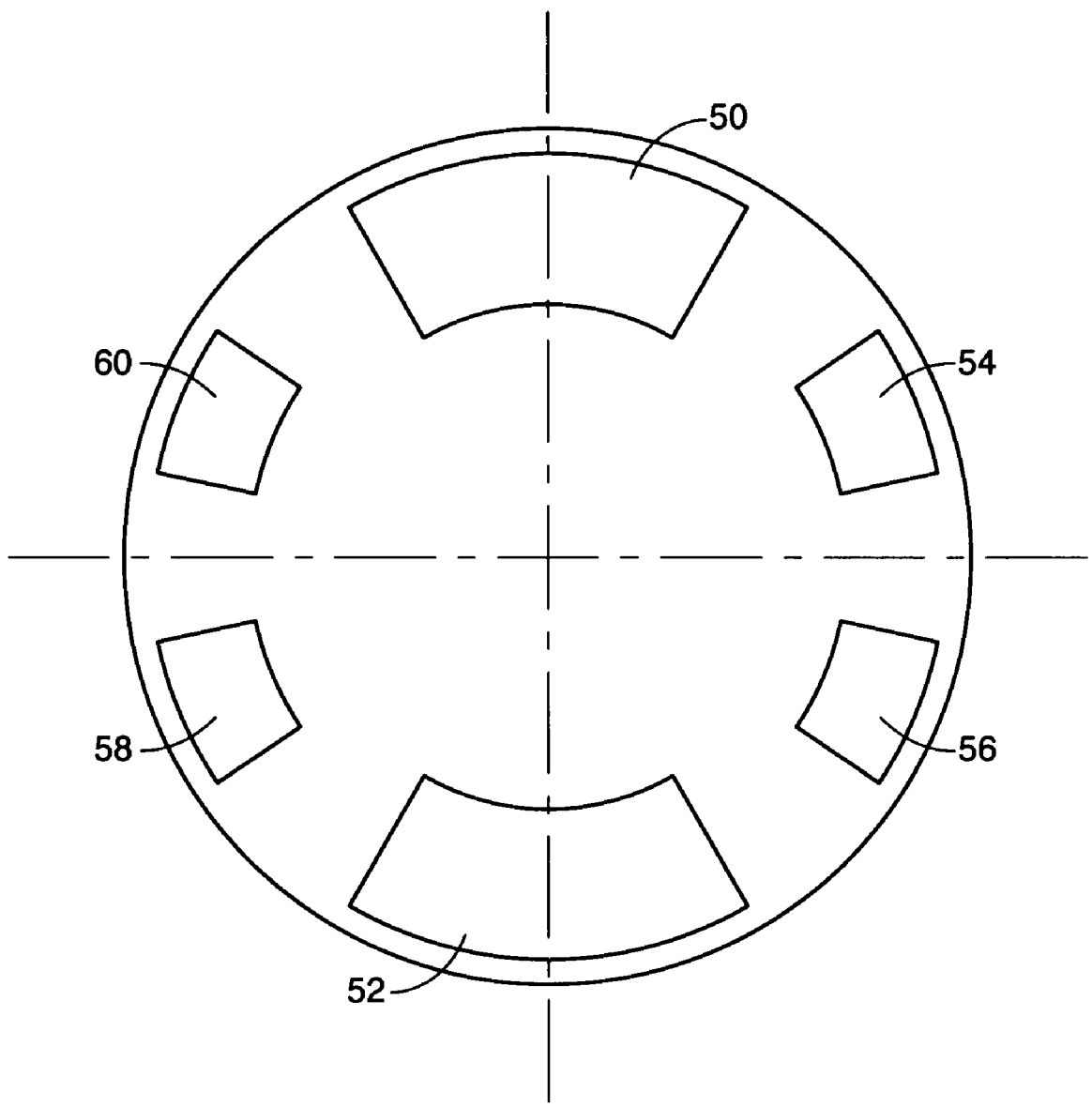
FIG. 5 depicts a shaped DOE or blade of an embodiment of the invention.
Figure 6:
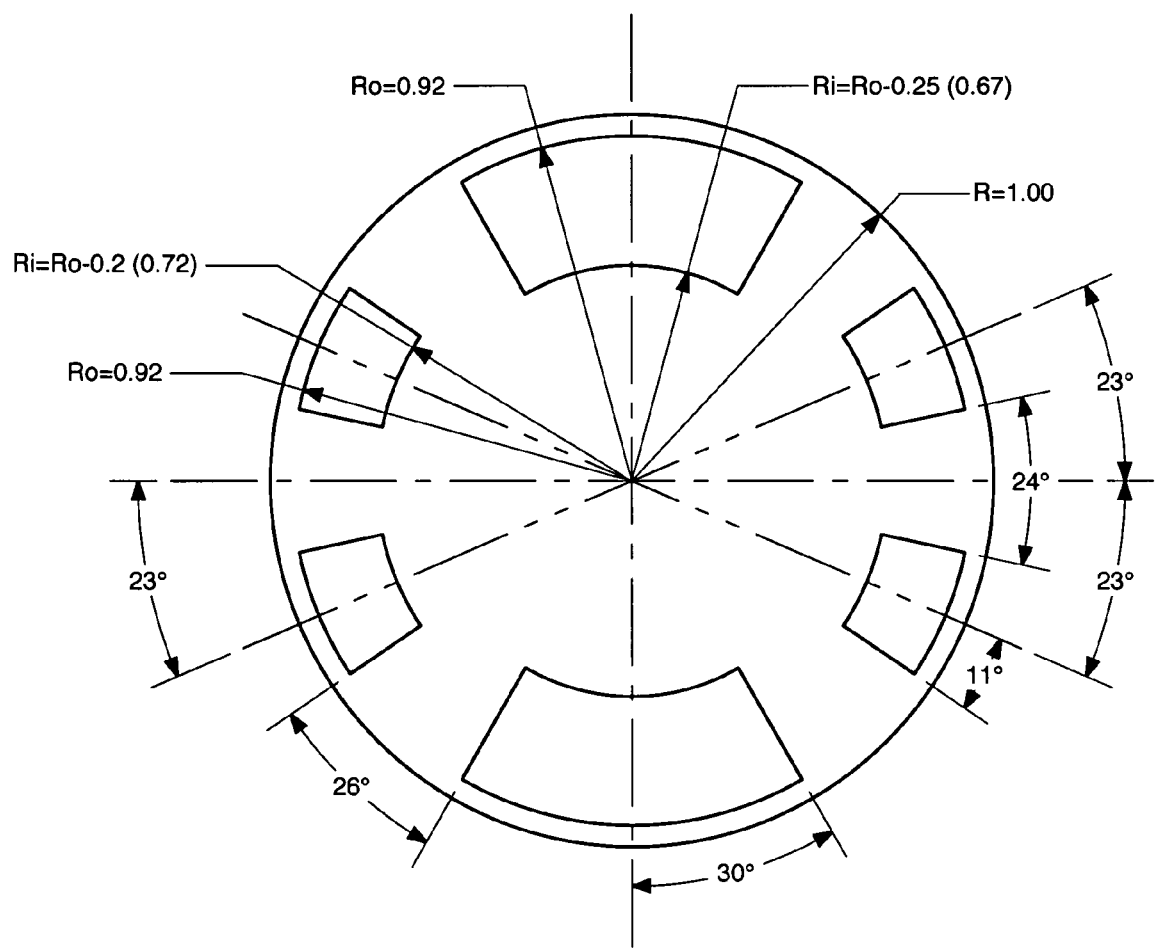
FIG. 6 depicts the FIG. 5 DOE or blade and includes dimensions of an exemplary embodiment.

FIGS. 5 and 6 are scale drawings depicting a DOE or blade having a particular inventive hexapole pattern embodiment which may be used during the patterning of features, specifically the patterning of features discussed below, during optical lithography using the system of FIG. 4. FIG. 6 depicts the FIG. 5 structure of a particular size. The radius dimensions shown in FIG. 6 are normalized sigma (σ) values for a radius of 1, and thus the actual measurement will be the σ values listed multiplied by the radius of the particular blade or DOE. The DOE depicted in FIG. 6 may be about 120 millimeters in diameter, for example for use with a model/800 scanner available from ASML Lithography, Inc. headquartered in Veldhoven, the Netherlands. The DOE or blade in this embodiment has six openings located about a first vertical central axis and a second horizontal axis perpendicular to the first axis. For purposes of explanation, the top of the vertical central axis (12 o'clock) of FIGS. 5 and 6 is designated as 0°, the bottom of the vertical central axis (6 o'clock) is designated as 180°, with 90° and 270° being at 3 o'clock and 9 o'clock respectively, along the horizontal second axis. The outside radius (Ro, outer sigma) for all six poles is 0.92. The DOE or blade may be any workable size generally to scale with the depiction of FIG. 5.

The first opening 50 and second opening 52, located at the top and bottom of FIG. 5, are substantially mirror images about the horizontal central axis. These largest two openings are centered around 0° and 180°, and each form an arc of 60°±10° centered about the vertical central axis (30°±5° on each side of the vertical central axis). The inner radius ($R_i$) or arc for these two openings is less than the outer arc by about 0.25 σ (i.e. about 0.67 94 ).

The center of each of the four smaller openings 54, 56, 58, 60 of FIG. 5 each respectively located 23° from the horizontal central axis and is depicted in FIG. 6, which illustrates the center radial axis of each opening. The openings are thus centered around 67°, 113°, 247°, and 293°. Each of the four smaller openings is defined by an arc of 22°±10° (11°±5° on each side of the horizontal central axis). The inside a for each of the four smaller openings is less than the outer arc by about 0.20 σ (i.e. about 0.72). These four openings are also of equidistance and mirror images about the vertical central axis and the horizontal central axis. The openings may also be described as being defined on first and second sides (inside and outside) by concentric arcs and on third and fourth sides (lateral sides which connect the inside and outside arcs) by nonparallel lines.

It will be appreciated by those skilled in the art with the benefit of the present description that the dimensions and locations of the openings may be optimized from those depicted in FIGS. 5 and 6 without departing from the present invention. Further, the outside radius (Ro) for all six openings listed is 0.92 σ, which results from equipment limitations. A larger outside radius (Ro) of up to 1.0 σ may be desirable but may not be possible based on available equipment configurations and limitations.

Depending on the particular optical lithography equipment used, the size of the DOE's depicted in FIGS. 5 and 6 herein may change but the scale will remain about the same. In general, the DOE's or blades for current technology, depending on the equipment, will vary less than about ±10% of that depicted in FIGS. 5 and 6, and more preferably to within about ±5% of that depicted. The DOE's of FIGS. 5 and 6 are different from a quadrupole element in that the openings are customized for a particular pattern, and for different patterns the openings must also be modified.

Figure 7:
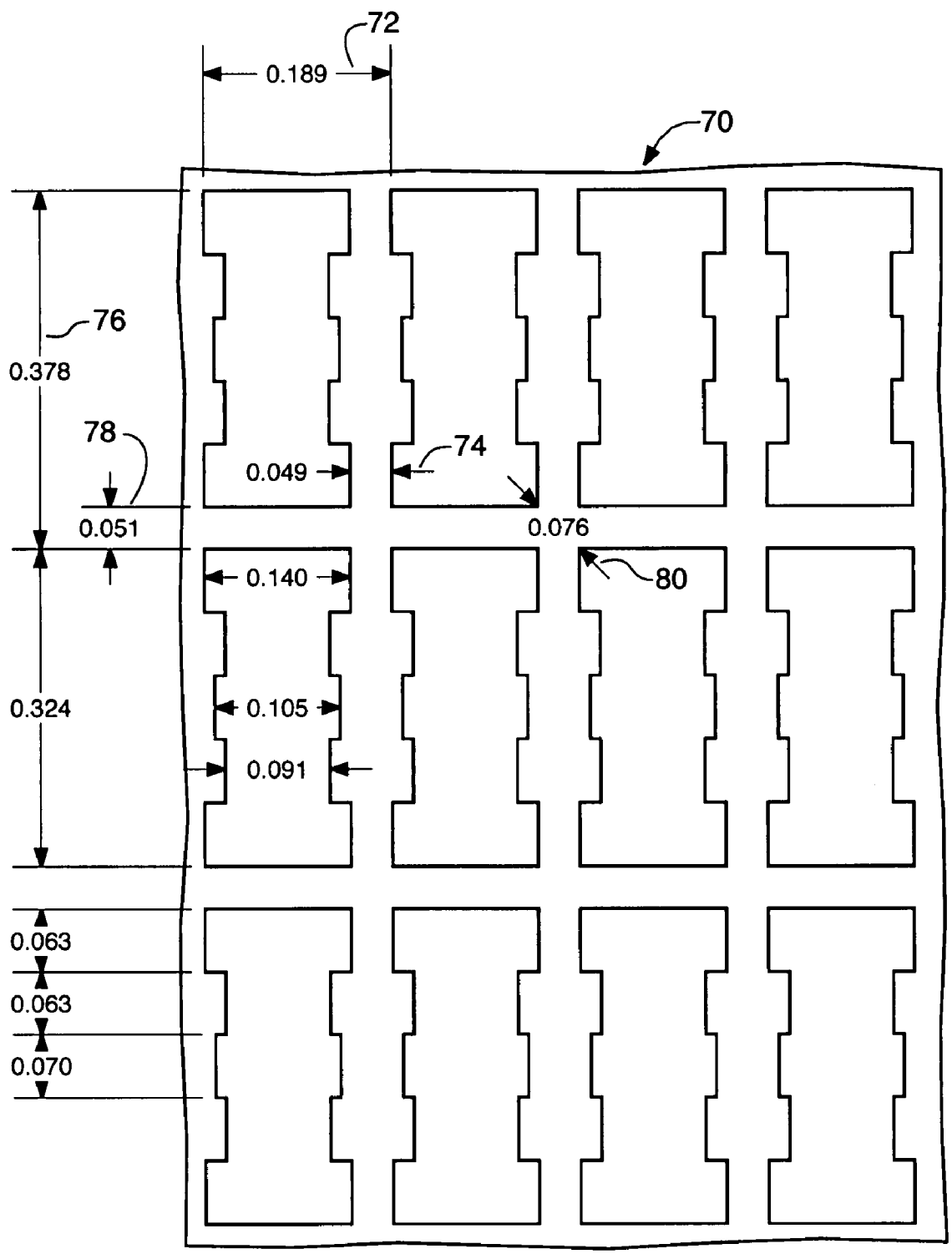
FIG. 7 depicts a field of container capacitors which may be formed using the DOE or blade of FIG. 5.

The DOE depicted in FIG. 5 is particularly useful for exposing patterns which have a very tight pitch in one direction and a less stringent but still significant pitch at between about 45° to about 90° to the first pitch. Such a structure may include a field of container capacitors 70 such as that depicted in FIG. 7, which depicts a plurality of openings each generally comprising an "I" shape. The pitch 72 of the container capacitors 70 in the x-direction is about 0.189 micron (μ) with a spacing 74 between capacitors of about 0.049 μ, and the pitch 76 in the y-direction is about 0.378 μ with a spacing 78 between capacitors of about 0.051 μ. It should be noted that the dimensions on FIG. 7 are on-wafer specifications and that the reticle values may be different, for example four times these numbers. It can be seen that the spacing 80 between capacitors at 45° to the FIG. 7 orientation is larger than at either the x- or y-directions. The DOE of FIG. 5 is oriented such that the horizontal axis of the DOE is aligned to the horizontal axis of the FIG. 7 orientation. The DOE of FIG. 5 may improve the depth of focus (DOF) and the normalized image log-slope (NILS) of the process, as well as the pattern fidelity.

In contrast to the optical element of an optical proximity correction RET, the DOE's of the present invention are not rotated relative to the wafer. Further, the orientation of the DOE is specific (exclusive) to the pattern orientation, and will remain in a fixed orientation to the orientation of the pattern.

Figure 8:
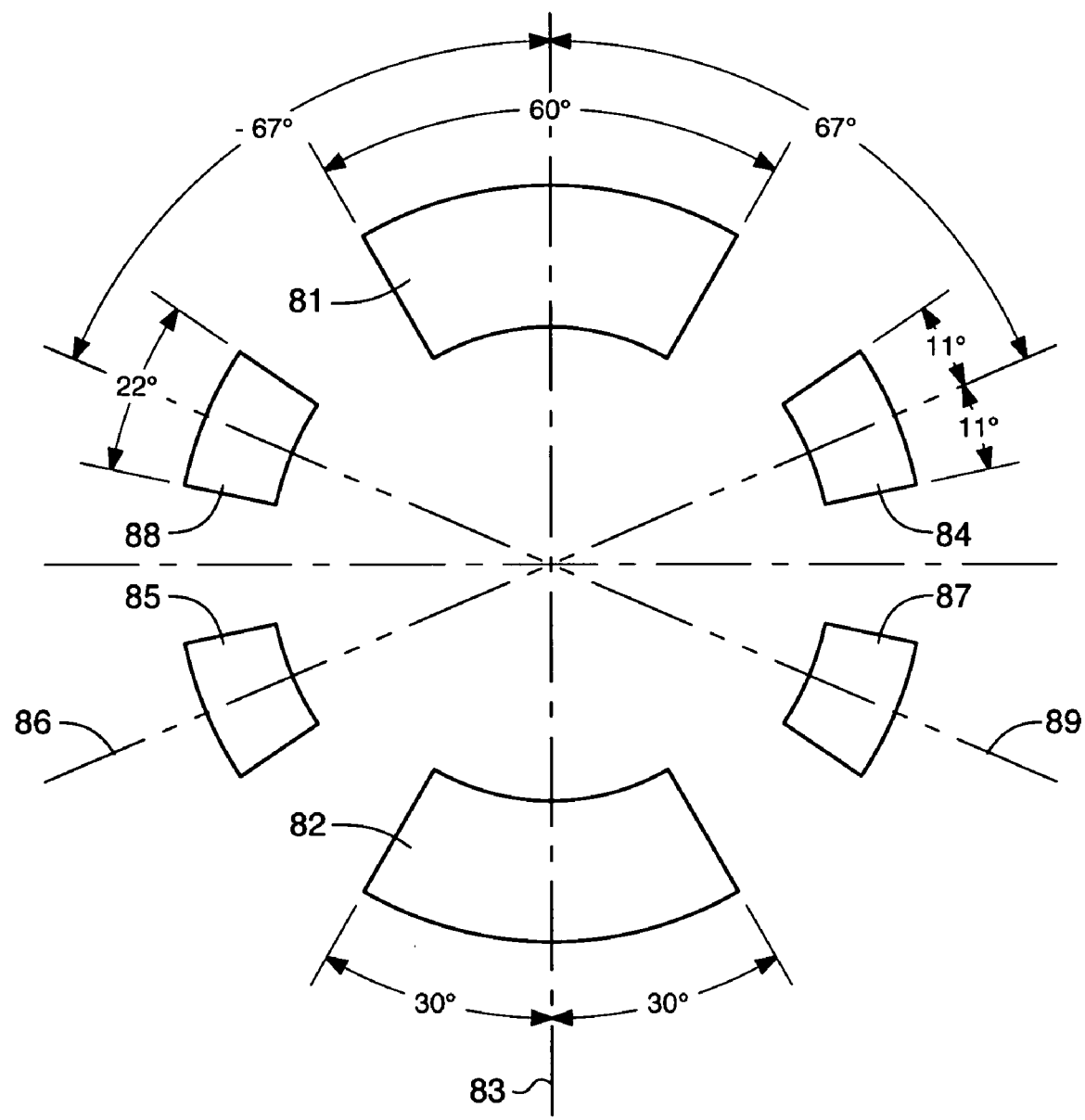
FIG. 8 is a schematic depiction of a light pattern similar to that which may be produced by passing a light source through the DOE or blade of FIG. 5.

The schematic pupilgram of FIG. 8 comprises first and second openings centered on a vertical axis and third, fourth, fifth, and sixth openings centered ±23° off each side of the horizontal axis (i.e. centered at 67°, 113°, 247°, and 293°). Each of the first and second openings sweeps circumferentially about 60° (±10°), with 30° on each side of the vertical axis. Each of the smaller four openings sweeps circumferentially about 22° (±10°). Each of the six dead zones depicted between the openings, therefore, sweeps circumferentially an average of about 25°, with a minimum of about 14° and a maximum of about 35°.

The schematic pupilgram of FIG. 8 thus represents a light pattern comprising areas having first light intensities and second light intensities, with the first intensity being higher than the second intensity. FIG. 8 depicts six pattern elements being regions of high intensity, with the remainder of the pupilgram being of low intensity. Two pattern elements 81, 82 are centered on the vertical axis 83, with each of these two elements sweeping about 60°, with about 30° on each side of the vertical axis. Two other pattern elements 84, 85 are centered on a second axis 86 which intersects the vertical axis 83 at an angle of about 67°. These two pattern elements each sweep about 22°, with about 11° on each side of this second axis. Two additional pattern elements 87, 88 are centered on a third axis 89 which intersects the vertical axis 83 at an angle of about 293° (-67°). These two additional pattern elements 87, 88 each sweep about 22°, with about 11° on each side of the third axis 89.

In addition to using a DOE or blade to form a light pattern which produces the pupilgram represented by FIG. 8, it is contemplated to produce a light pattern which results in this pupilgram using a lens-only system. This may be implemented using a system that adds to the axicon pupil shaper. The adjustable lens elements follow the axicon lens unit, and shape the beam using a group of diffractive lenses to derive the desired pupil shape.

Figure 9:
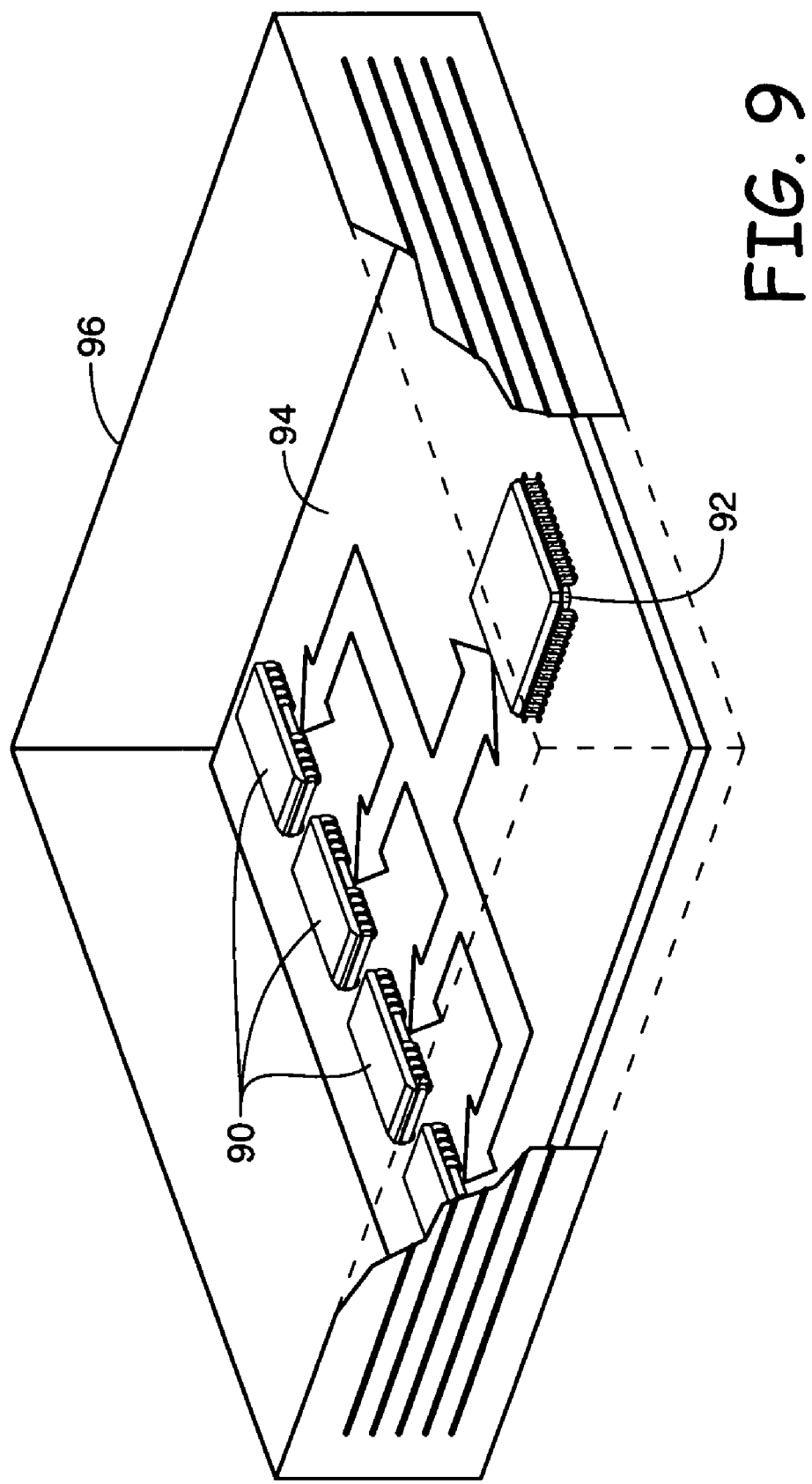
FIG. 9 is an isometric depiction of various components which may be manufactured using devices formed using an embodiment of the present invention.

As depicted in FIG. 9, a semiconductor device 90 such as formed in a memory device in accordance with the invention may be attached along with other devices such as a microprocessor 92 to a printed circuit board 94, for example to a computer motherboard or as a part of a memory module used in a personal computer, a minicomputer, or a mainframe 96. FIG. 9 may also represent use of device 90 in other electronic devices comprising a housing 96, for example devices comprising a microprocessor 92, related to telecommunications, the automobile industry, semiconductor test and manufacturing equipment, consumer electronics, or virtually any piece of consumer or industrial electronic equipment.

Figure 10:
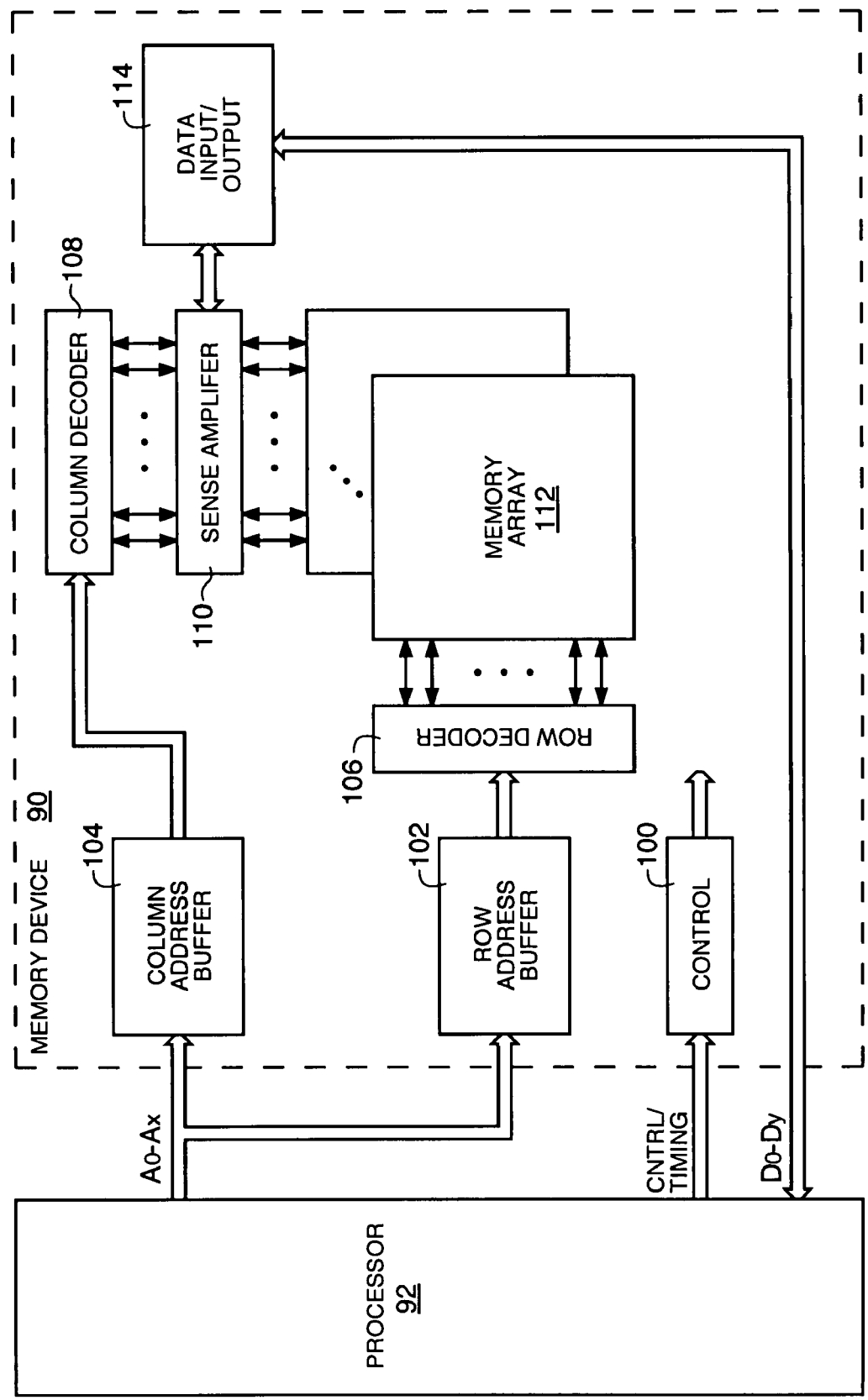
FIG. 10 is a block diagram of an exemplary use of the invention to form part of a transistor array in a memory device.

The process and structure described herein can be used to manufacture a number of different structures which comprise a structure formed using a photolithographic process. FIG. 10, for example, is a simplified block diagram of a memory device such as a dynamic random access memory having digit lines and other features which may be formed using an embodiment of the present invention. The general operation of such a device is known to one skilled in the art. FIG. 10 depicts a processor 92 coupled to a memory device 90, and further depicts the following basic sections of a memory integrated circuit: control circuitry 100; row 102 and column 104 address buffers; row 106 and column 108 decoders; sense amplifiers 110; memory array 112; and data input/output 114.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A light mask for use in an optical lithography patterning apparatus, comprising:
   a central axis;
   first and second openings therein being of equidistance and mirror images with each other centered about the central axis, said first and second openings each being defined on first and second sides by concentric arcs each having an arc length of 60°±10° and being further defined on third and fourth sides by first and second nonparallel lines having a radial length extending from about 0.67 sigma (σ) to at least about 0.92 σ; and third, fourth, fifth, and sixth openings therein, wherein the third and fourth openings are of equidistance and mirror images with each other about the central axis and the fifth and sixth opening are of equidistance and mirror images with each other about the central axis, said third, fourth, fifth, and sixth openings each being defined on first and second sides by concentric arcs each having an arc length of 22°±10° and being further defined on third and fourth sides by nonparallel lines having a radial length extending from about 0.72 σ to at least about 0.92 σ.

2. The light mask of claim 1 wherein:

the central axis is a first central axis and the apparatus further comprises a second central axis which is perpendicular to the first central axis;

the third and fifth openings are of equidistance and mirror images with each other about the second central axis; and the fourth and sixth openings are of equidistance and mirror images with each other about the second central axis.

3. The light mask of claim 2 wherein each of the third, fourth, fifth, and sixth openings comprises an axis which extends through a middle of both the first and second sides of each opening, and a distance between each axis of each of the third, fourth, fifth, and sixth openings and the second central axis is about 23°.

4. The light mask of claim 1 wherein the first side of each of the openings of the light mask defines an inner arc of each opening, wherein a σ of the inner arcs of the first and second openings is less than a a of the inner arcs of the third, fourth, fifth, and sixth openings.

5. The light of claim 4 wherein the second side of each of the openings of the light mask defines an outer arc of each opening, wherein a σ of each of the openings is about the same.

6. An optical lithography system comprising a photolithographic light mask, wherein the light mask comprises:

a central axis;

first and second openings therein being of equidistance and mirror images with each other centered about the central axis, said first and second openings each being defined on first and second sides by concentric arcs each having an arc length of 60°±10° and being further defined on third and fourth sides by first and second nonparallel lines having a radial length extending from about 0.67 sigma (σ) to at least about 0.92 σ; and third, fourth, fifth, and sixth openings therein, wherein the third and fourth openings are of equidistance and mirror images with each other about the central axis and the fifth and sixth opening are of equidistance and mirror images with each other about the central axis, said third, fourth, fifth, and sixth openings each being defined on first and second sides by concentric arcs each having an arc length of 22°±10° and being further defined on third and fourth sides by nonparallel lines having a radial length extending from about 0.72 σ to at least about 0.92 σ.

7. The optical lithography system of claim 6 further comprising:

an illuminator adapted to provide a light source;

a zoom axicon adapted to alter the size and position of the light source;

an optical homogenizer adapted to normalize an intensity of the light source to remove granularity from the light source; and a lens adapted to focus the light source onto a photosensitive film.

8. The optical lithography system of claim 6 further comprising a light path which extends from the illuminator to the lens, wherein the light mask is a diffractive optical element and is located in the light path between the illuminator and the zoom axicon.

9. The optical lithography system of claim 6 further comprising a light path which extends from the illuminator to the lens, wherein the light mask is a blade and is located in the light path between the optical homogenizer and the lens.

* * * * *

UNITED STATES PATENT AND TRADEMARK OFFICE
CERTIFICATE OF CORRECTION

| | | |
|---|---|---|
| PATENT NO. | : 7,283,205 B2 | Page 1 of 1 |
| APPLICATION NO. | : 11/038673 | |
| DATED | : October 16, 2007 | |
| INVENTOR(S) | : Mackey et al. | |

It is certified that error appears in the above-identified patent and that said Letters Patent is hereby corrected as shown below:

In column 7, line 34, in Claim 4, after "than a" delete "a" and insert -- σ -- therefor.

Signed and Sealed this

Twenty-fifth Day of December, 2007

JON W. DUDAS
*Director of the United States Patent and Trademark Office*